United States Patent [19]

Cranston

[11] Patent Number: 4,563,811
[45] Date of Patent: Jan. 14, 1986

[54] METHOD OF MAKING A DUAL-IN-LINE PACKAGE

[75] Inventor: Benjamin H. Cranston, Hopewell Township, Mercer County, N.J.

[73] Assignee: AT&T Technologies, Inc., Berkeley Heights, N.J.

[21] Appl. No.: 546,714

[22] Filed: Oct. 28, 1983

[51] Int. Cl.[4] .............................................. H01R 43/00
[52] U.S. Cl. ........................................ 29/827; 357/70; 148/13
[58] Field of Search ...................... 29/827; 174/52 FP; 339/278 C; 357/70; 428/577, 596; 148/13

[56] References Cited

U.S. PATENT DOCUMENTS

| | | | |
|---|---|---|---|
| 3,469,953 | 9/1969 | St. Clair et al. | 357/70 X |
| 3,684,464 | 8/1972 | Happ et al. | 357/70 X |
| 3,698,074 | 10/1972 | Helda et al. | 29/423 X |
| 3,978,516 | 8/1976 | Noe | 357/70 |
| 4,141,029 | 2/1979 | Dromsky | 357/70 |
| 4,151,014 | 4/1979 | Charschan et al. | 148/13 |
| 4,234,666 | 11/1980 | Gursky | 357/70 X |
| 4,331,831 | 5/1982 | Ingram et al. | 174/52 FP |
| 4,413,404 | 11/1983 | Burns | 357/70 X |

*Primary Examiner*—Howard N. Goldberg
*Assistant Examiner*—Carl J. Arbes
*Attorney, Agent, or Firm*—D. J. Kirk

[57] ABSTRACT

A lead frame (10) having external leads (26—26) and internal leads (22—22). The internal leads (22—22) are made of soft metal to provide bondability to ceramic substrates having a semiconductor chip thereon while the external leads (26—26) are hard metal to facilitate insertion thereof into a PWB. The lead frame (10) is fabricated by providing a hard metal strip (50) with a soft metal stripe (52) along the central portion thereof. Lead patterns (17—17) are punched in the strip (50) in such a manner as to punch the internal leads (22—22) from the soft metal while simultaneously punching most of the external leads (26—26) from the hard metal. The stripe (52) may be formed by annealing, inlaying or a separate piece of soft metal bonded to two outer hard metal sections (56—56).

3 Claims, 9 Drawing Figures

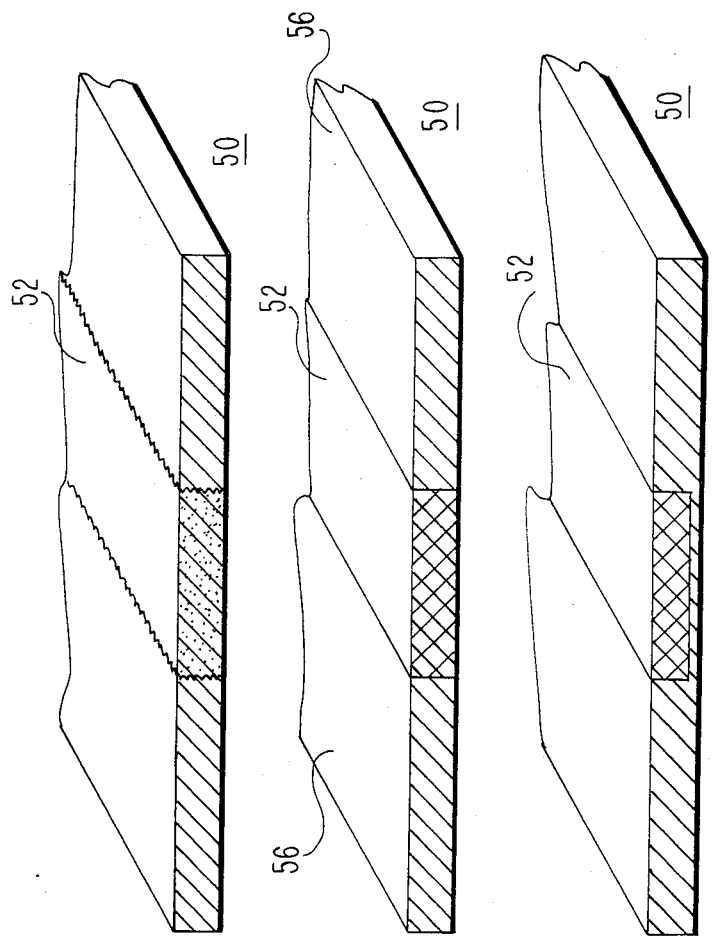

METHOD OF MAKING A DUAL-IN-LINE PACKAGE

TECHNICAL FIELD

The instant invention relates to a method of fabricating a lead frame for use in a dual-in-line package.

BACKGROUND OF THE INVENTION

Dual-in-line packages (DIP's) are well known in the art. The package typically contains one or more electrical devices forming circuitry which is encapsulated in a molded body portion. The molded body has a pair of rows of parallel leads depending therefrom which are electrically connected to the circuitry. Typically, the two rows of leads are inserted into apertures in a Printed Wiring Board (PWB) and soldered to metallized patterns thereon.

One technique for fabricating such a package starts with a continuous strip of metal which is punched to form repetitive, electrically conductive patterns having a centrally located inner array of leads and an outer set of leads. Metallized ceramic substrates, having a semiconductor device thereon, are thermocompressively bonded to the inner sets of leads and the ceramic substrates are then encapsulated in an insulative material which forms the body portion of the DIP. The strip is then cut in sections which comprise the body portion with the outer leads extending laterally therefrom. The outer leads are then bent at an angle of approximately 90° from the plane of the body portion for insertion into PWB's.

In order to thermocompressively bond the inner leads to the metallized ceramic substrate the leads must be relatively soft. However, in order to substantially preclude misinsertions of the outer leads into the PWB, it is necessary that they be relatively hard. Misinsertions of DIP's into PWB's in a high speed fabrication process results in costly downtime and manual replacement or repair.

Various techniques have been used to overcome the foregoing problem. In particular, the ends of the inner leads have been selectively annealed by lasers or other heating means.

Although the foregoing solutions have met with varying degrees of success, they are time consuming and costly. Accordingly, there is a need for an inexpensive and efficient technique for fabricating a lead frame having soft inner leads and hard outer leads.

SUMMARY OF THE INVENTION

The foregoing problems are overcome with a lead frame having a pattern of inner and outer leads which are punched out of a strip of metal wherein the strip is comprised of a relatively hard metal material with selected areas of soft metal from which the inner leads will be punched.

In one embodiment the strip is comprised of a relatively hard metal material with a stripe of soft metal along the length thereof which includes the area from which the inner leads are punched.

Advantageously, such a lead frame provides soft inner leads that can readily be thermocompressively bonded to a ceramic substrate with most of the outer leads being relatively hard to permit ease of insertion into PWB's.

BRIEF DESCRIPTION OF THE DRAWINGS

FIGS. 5 to 7 show various strips of hard metal having a centrally located soft metal stripe.

DETAILED DESCRIPTION

Figure 1:
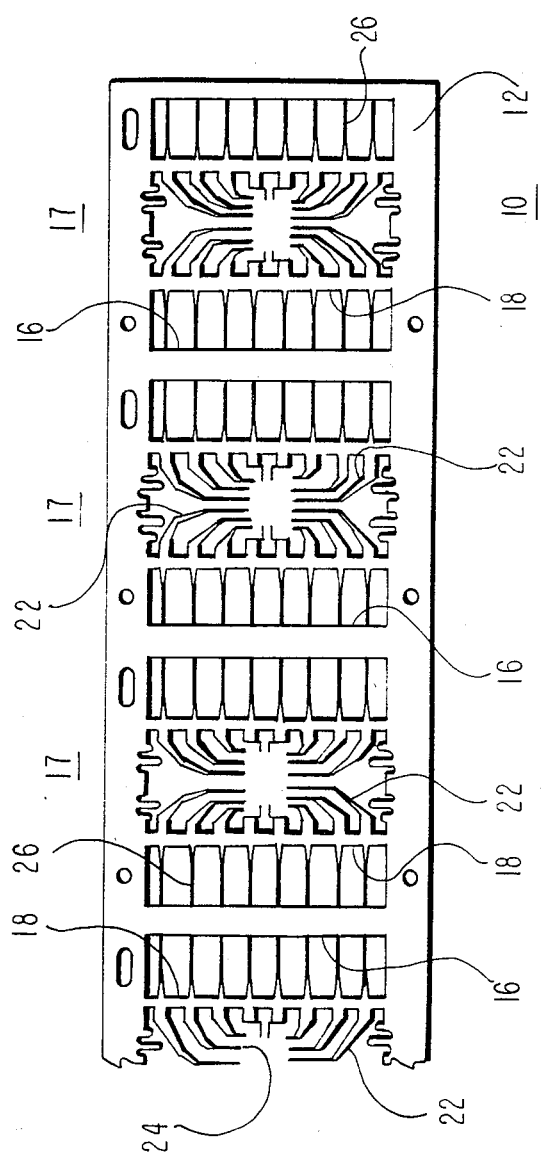
FIG. 1 depicts a lead frame.

The use of lead frames are well known in the electronic circuit fabrication art. One particular lead frame 10 is shown in FIG. 1. The lead frame 10 is comprised of a pair of lateral support members 12—12 connected together by a plurality of tie bars 16—16 with a repetitive lead pattern 17 therebetween. Additionally, a plurality of support members 18—18 are connected between the tie bars 16—16. Each lead pattern 17 is comprised of a plurality of internal leads 22—22 which extend from the support members 18—18 to a centrally located rectangular array of ends 24—24. A plurality of external leads 26—26 are parallel to the lateral support members 12—12 and connected between the tie bars 16—16 and the support members 18—18.

Typically, the lead frame 10 is fabricated (see FIG. 2) by indexing a continuous soft metal (e.g., CDA 102 copper or the like) strip 27 into a punch press which repetitively punches out the lead pattern 17. The ends 24—24 of the leads 22—22 and leads 26—26 are then electroplated with gold and a metallized ceramic substrate 36 having a semiconductor chip bonded thereto is placed in contact therewith and the ends of the internal leads bonded thereto.

Figure 2:
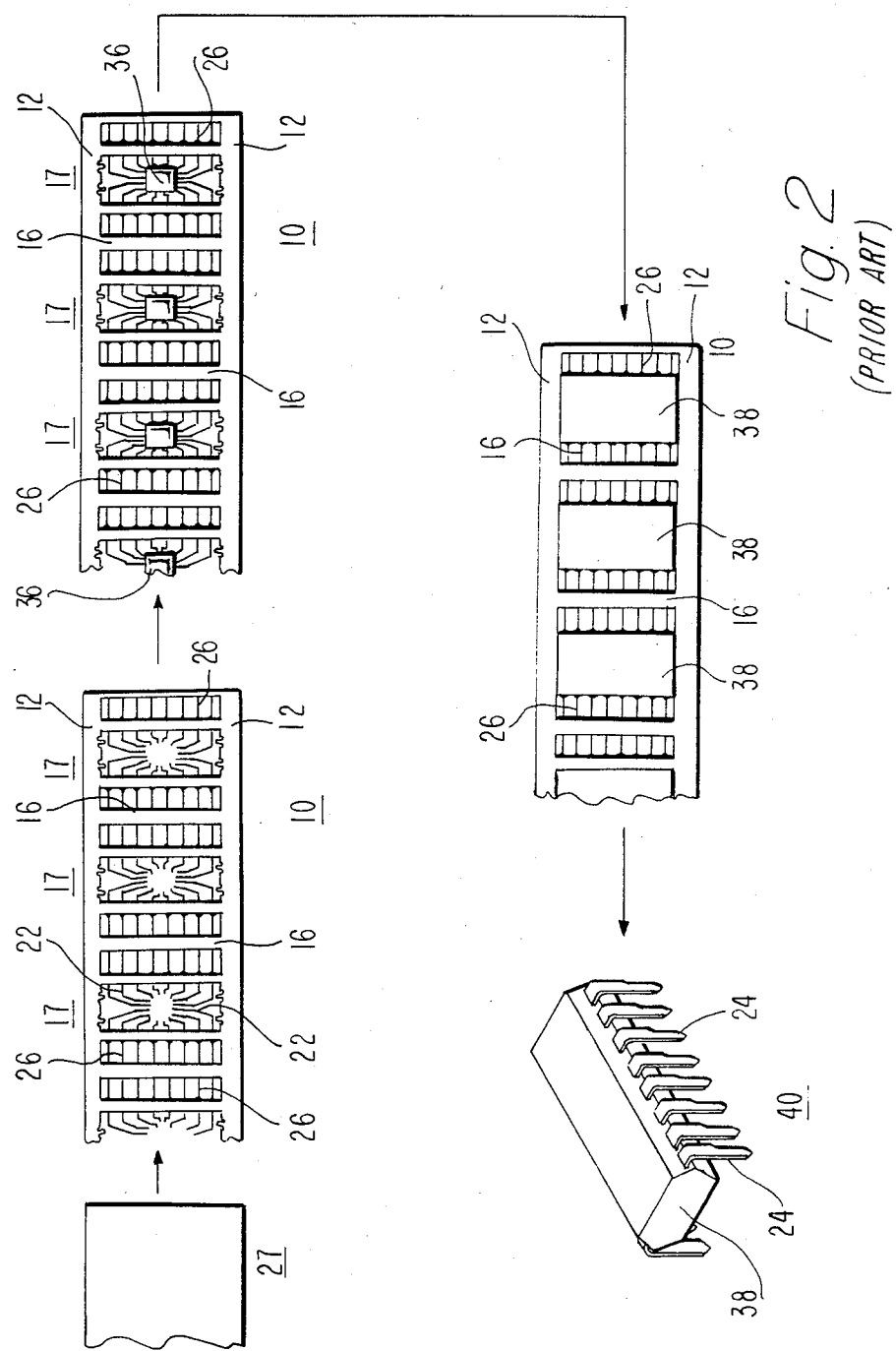
FIG. 2 shows the steps of fabricating a DIP.

The semiconductor chips on the ceramic substrates 36 may then be encapsulated with RTV silicone rubber (not shown) in a well known manner and the lead frame 10 placed in a molding machine wherein a body 38 of plastic material (e.g., epoxy, silicon, etc.) is formed about a portion of each pattern 17 as shown in FIG. 2. The lead frame 10 is then cut into individual sections and the leads trimmed and formed into a DIP 40. As hereinbefore indicated it is most desirable to have the ends 24—24 of the internal leads 22—22 be soft for thermocompressive bonding purposes while having the external leads 26—26 hard for purposes of ease of insertion into apertures in a PWB (not shown). However, when using a soft metal strip the leads 26—26 are easily bent or deformed causing misinsertions of the DIP 40.

Figure 3:
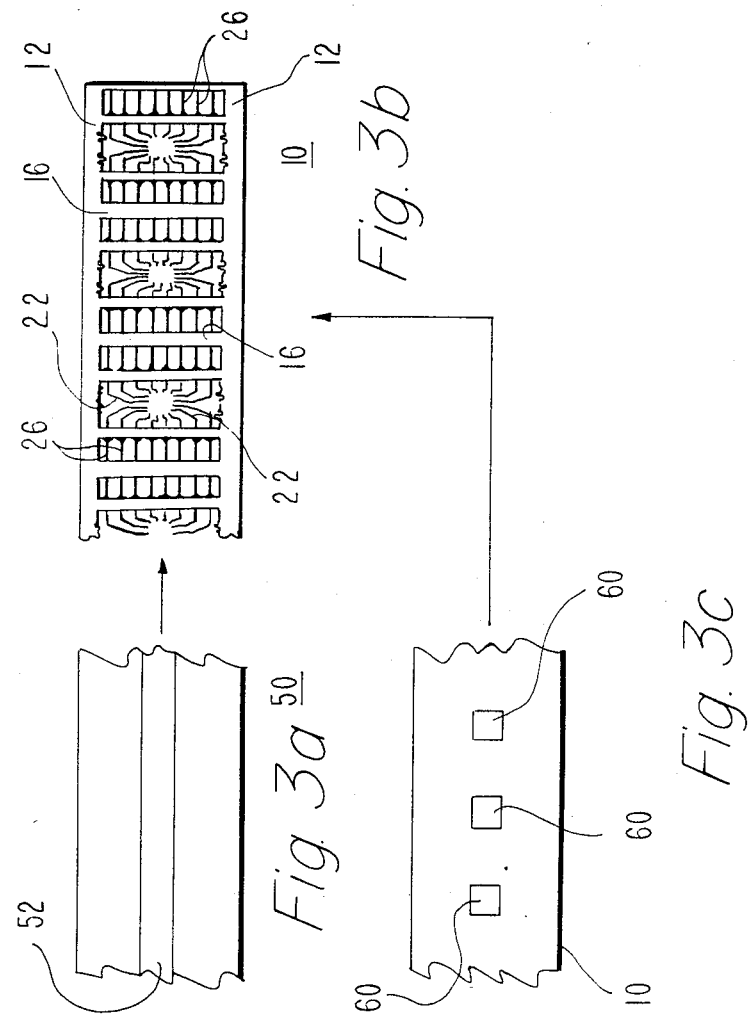
FIGS. 3A to 3C depict alternate embodiments for fabricating a lead frame with hard external lead and soft internal leads.
Figure 4:
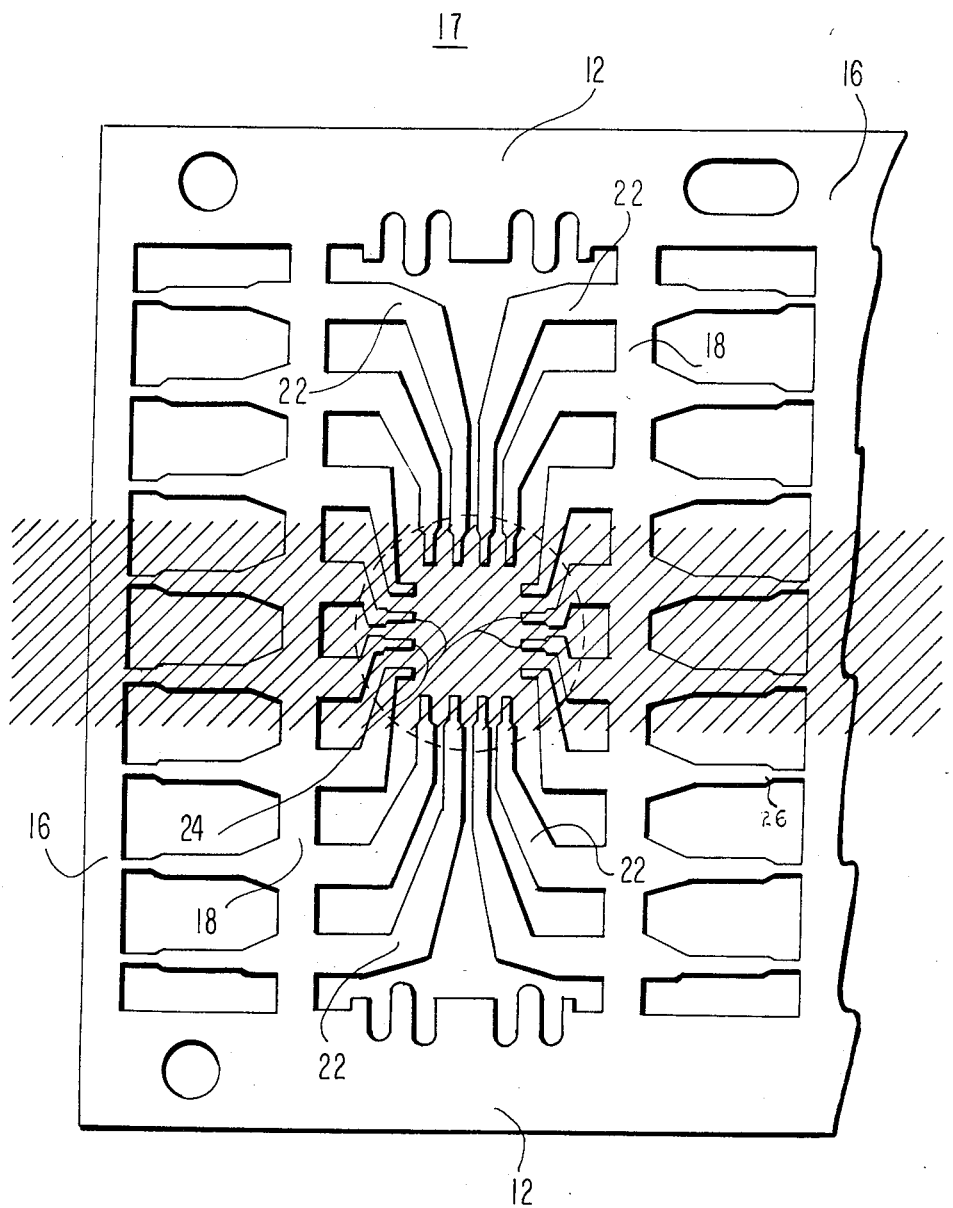
FIG. 4 is a detailed view of a section of a lead frame.

The instant invention overcomes these problems by providing a starting strip 50 (see FIG. 3A) of relatively hard metal (e.g., having a hardness between approximately 180 DPH and 200 DPH) with a stripe 52 of relatively soft metal (e.g., having a hardness between 80 DPH and 110 DPH) along the central portion thereof from which the central arrays of lead ends 24—24 will be punched. The remaining fabrication steps will be as hereinbefore described resulting in all the internal lead ends 24—24 being sufficiently soft to provide acceptable thermocompression bonding characteristics. Although several of the external leads 26—26 (e.g., four shown under the shaded area in FIG. 4) will be softened it has been discovered that their effect upon misinsertions is minimal. In fact, data collected from insertion studies indicated that approximately 91% of the misinsertions of DIP's 40—40 using CDA 195 copper were corner leads. Therefore, having a soft metal stripe 52 down the center of a hard copper lead frame strip 50 does not have a detrimental effect on insertion yields.

Alternatively, the lead pattern 17 may be redesigned with the outer leads 26—26 being perpendicular to the support members 12—12. This will result in only the lead ends 24—24 becoming soft while all the leads 26—26 remain hard.

The soft metal center stripe 52 (shown in FIG. 3A) can be formed in the hard metal 50 in several ways as indicated in FIGS. 5 to 7. A zone annealing process (FIG. 5) may be used wherein a strip 50 approximately 0.010 inch thick and 1.00 inch wide, is annealed to form a soft metal stripe 52, approximately 0.225 inch wide, using an electron beam, a laser or the like. Alternatively, a bi-metal strip 50 (see FIG. 6) may be used wherein the outer sections 56—56 are made of the hard metal which is electron beam or laser bonded to the stripe 52 which is of a softer metal material. A further embodiment (see FIG. 7) would be the use of soft metal which is inlayed into the harder metal in a well known manner.

In a further alternative (see FIG. 3C) the hard strip 10 may be selectively annealed by a heating means (e.g., laser, electron beam) at the locations 60—60 at which the internal leads 22—22 before or after the punching operation. Such a technique will result in all the external leads 24—24 being hard while all the internal leads will be soft.

It is to be understood that the embodiments described herein are merely illustrative of the principles of the invention. Various modifications may be made thereto by persons skilled in the art which will embody the principles of the invention and fall within the spirit and scope thereof.

What is claimed is:

1. A method for fabricating a dual-in-line package having internal leads thermocompression bonded to a ceramic substrate and external leads depending from a body portion molded about the ceramic substrate, the method comprising the steps of:
    indexing an elongated, hard metal strip, having a soft metal stripe through the central portion thereof, through a punching apparatus;
    punching the strip to form a pattern of internal and external leads wherein the internal leads are formed of the soft metal and the external leads are formed of hard metal; and
    thermocompressively bonding the soft internal leads to a metallized ceramic substrate.

2. The method as set forth in claim 1, comprising the additional steps of:
    molding an insulative body portion about the ceramic substrate; and
    cutting and forming the external leads at an angle to the body portion.

3. A method of fabricating a dual-in-line package having internal leads thermocompression bonded to a metallized ceramic substrate and external leads depending from a body portion molded about the ceramic substrate, the method comprising the steps of:
    indexing a lead frame, punched from a hard metal strip having a soft metal stripe along and through the central portion thereof, past a thermocompression bonding apparatus;
    placing a metallized ceramic substrate on the inner leads;
    thermocompressively bonding the soft leads to the metallized ceramic substrate;
    molding an insulative body portion about the ceramic substrate; and
    cutting and forming the hard external leads at an angle to the body portion.

* * * * *